United States Patent
Nellissen

Patent Number: 5,937,493
Date of Patent: Aug. 17, 1999

[54] METHOD OF MANUFACTURING AN ELECTRONIC MULTILAYER COMPONENT

[75] Inventor: Antonius J. M. Nellissen, Eindhoven, Netherlands

[73] Assignee: U.S. Philips Corporation, New York, N.Y.

[21] Appl. No.: 08/622,506

[22] Filed: Mar. 25, 1996

[30] Foreign Application Priority Data

Mar. 27, 1995 [EP] European Pat. Off. .............. 95200751

[51] Int. Cl.$^6$ ...................................................... H01G 7/00
[52] U.S. Cl. .......................... 29/25.35; 29/25.42; 29/620; 427/79; 427/100
[58] Field of Search ............................... 29/25.42, 25.35, 29/620; 427/79, 100

[56] References Cited

U.S. PATENT DOCUMENTS 3,326,718  6/1967  Dill .......................................... 117/212

Primary Examiner—Timothy V. Eley
Assistant Examiner—Benjamin M. Halpern
Attorney, Agent, or Firm—Norman N. Spain

[57] ABSTRACT

A method of manufacturing a plurality of electronic multilayer components is disclosed in which each multilayer component comprises alternately stacked electrically conductive layers and electrically insulating layers, the electrically conductive layers being electrically connected in a periodically alternate arrangement to different edges of the multilayer component. The method comprises the steps of providing a substrate which is endowed with a regular pattern of surface protrusions on one face; depositing individual multilayer components into intervening spaces delimited by the protrusions; depositing electrically conductive layers for connection to a given edge of a multilayer component, wherein each connection occurs at an angle (θ) of less than 90° with respect to the substrate face in a direction extending towards the surface protrusion delimiting the respective edge; depositing each electrically insulating layer so as to completely cover a preceding electrically conductive layer; after deposition of the desired multilayer composition, planing the side of the substrate on which deposition occurred so as to expose edges of the electrically conductive layers; depositing a connecting body of electrically conductive material over selected groupings of the exposed edges; and separating completed individual multilayer components from one another by severing the substrate along the surface protrusions.

7 Claims, 6 Drawing Sheets

METHOD OF MANUFACTURING AN ELECTRONIC MULTILAYER COMPONENT

BACKGROUND OF THE INVENTION

1. Field of the Invention

The invention relates to a method of manufacturing a plurality of electronic multilayer components, each of which comprises alternately stacked electrically conductive and electrically insulating layers, the electrically conductive layers being electrically connected in a periodically alternate arrangement to different edges of the multilayer component. Such components may receive application as multilayer capacitors or multilayer actuators, example.

2. Discussion of the Related Art

A method as described in the opening paragraph is known from U.S. Pat. No. 3,326,718, in which layers of electrically conductive and electrically insulating material are alternately deposited onto a flat substrate through an apertured mask, the planes of the substrate and mask being mutually parallel. In the case of the insulating material, the depository flux is directed at right angles to the plane of the mask, so that it passes through the aperture in a perpendicular direction. However, in the case of the conductive material, the depository flux is directed through the aperture at a non-perpendicular angle $\alpha$ with respect to the substrate surface. Moreover, although consecutive conductive layers are deposited using the same value of $\alpha$, the depository fluxes for such consecutive layers are not mutually parallel, but instead arise from sources located at diametrically opposite sides of the aperture. As a result, consecutive conductive layers demonstrate only a partial mutual overlap, as illustrated in FIG. 2 of the cited U.S. patent. At the same time, as shown in FIG. 4 of that patent, conductive layers (56, 56') having an odd ordinal number make mutual electrical contact at one side (62) of the component, and conductive layers (68, 68') having an even ordinal number make mutual electrical contact at an other side (76) of the component.

The known method has a number of disadvantages. In particular, the number of conductive layers which can be deposited in this manner is severely limited. This is because, as the stack of layers on the substrate increases in height, that stack will itself begin to partially eclipse the depository fluxes of conductive material, and will eventually prevent the desired mutual contact of every second conductive layer at the edge of the component. In such a scenario, the finished component will have to be provided along its sides with blanketing layers of conductive material (such as solder), for the purpose of achieving uninterrupted interconnection of the conductive layers terminating at each given side. However, because such blanketing layers are at the sides of the component, they are not directly compatible with surface mounting techniques, which require the component's electrical contacts to be located in a single plane.

SUMMARY OF THE INVENTION

It is an object of the invention to provide an alternative method of manufacturing electronic multilayer components. It is a specific object of the invention that such a method should allow the provision of a great plurality of layers in such multilayer components. In particular, it is an object of the invention that the components thus obtained should be directly surface mountable. Moreover, it is an object of the invention that such components may, if so desired, comprise more than two electrical contacts.

These and other objects are achieved in a method as stated in the opening paragraph, which is characterised in that:

(a) Use is made of a substrate which is endowed with a regular pattern of surface protrusions on one face;
(b) The individual multilayer components are deposited into the intervening spaces delimited by the protrusions;
(c) Deposition of electrically conductive layers for connection to a given edge of a multilayer component occurs at an angle of less than 90° with respect to the substrate face, in a direction extending towards the surface protrusion delimiting the said edge;
(d) Each electrically insulating layer is deposited so as to completely cover the preceding electrically conductive layer;
(e) After deposition of the desired multilayer composition, the side of the substrate on which deposition occurred is planed, so as to expose one edge of each electrically conductive layer;
(f) Selected groupings of the exposed edges are mutually interconnected by depositing a contacting body of electrically conductive material over them;
(g) The completed individual multilayer components are separated from one another by severing the substrate along the surface protrusions.

The surface protrusions referred to in point (a), in combination with the non-perpendicular depository direction specified in point (c), allow the exploitation of shadow effects during deposition of the conductive layers.

The most striking advantage of the inventive method is that it allows highly efficient provision of electrical contacts on the multilayer components, in a manner which is directly compatible with surface mounting techniques. This aspect is illustrated inter alia in FIGS. 13–15, which show the invention's characteristic "top contacts", as opposed to the "wrap-around side contacts" characteristically encountered in the prior art. The presence of such top contacts is attributable to the inventive surface protrusions, which provide a means by which individual layers parallel to the substrate face can be upturned and caused to run perpendicular to the substrate face, as illustrated in FIG. 9. In particular, since the planing procedure occurring in step (e) simultaneously provides individual "top access" to the entire plurality of components on the substrate, the inventive contacting procedure can be completed in one go for all components before mutual separation occurs.

A further advantage of the inventive method is that a great plurality of layers (as many as several hundred) can be provided in each multilayer component, without the occurrence of the undesired eclipsing effects referred to hereabove with respect to the cited U.S. patent.

The surface protrusions on the face of the employed substrate can be provided using a number of different techniques. For example, such protrusions may be created by depositing material through a patterned mask onto a planar substrate, or by employing a pressing or injection moulding technique in combination with an impressible substrate material, such as a polymer or ceramic material. However, particularly satisfactory results are achieved when the surface protrusions are provided by patternwise selective removal of substrate material with the aid of an etching technique. In specific exemplary embodiments of such a technique, suitable hollows can be etched into any of the following substrates:

a smooth glass plate, using a patterned mask in combination with Reactive Ion Etching;

a photo-sensitive glass plate, using a combination of lithography, actinic irradiation and wet etching;

a Si(110) wafer, exploiting selective etching along crystal planes using aqueous KOH (potassium hydroxide);

a SiO$_2$ or Si$_3$N$_4$ layer provided on a Si wafer, using a mask in combination with plasma etching. This list is given by way of example only, and is by no means exhaustive.

In general, the inventive method will be applied to manufacture multilayer components having only two electrical contacts, as in the case of a typical multilayer capacitor, for example. In such a case, the employed regular pattern of surface protrusions on the substrate face may take the form of an orthogonal grid (as in FIG. 2), the intervening spaces ("cells") delimited by the protrusions being essentially rectanguloidal in form. During the deposition process, the depository fluxes corresponding to consecutive conductive layers are then preferably directed perpendicular to one of two opposite edges of the cell, in alternation (as illustrated in FIGS. 4 and 6). As an alternative, the employed pattern of surface protrusions may be embodied simply as a series of parallel walls.

However, the inventive method also allows the manufacture of a multilayer component with three electrical contacts, as in the case of, for example, a piezoelectric actuator with incorporated sensor electrodes, or a decoupling capacitor. In this case, the pattern of surface protrusions may take the form of a honeycomb, in which the cells have a regular hexagonal form when viewed in plan. During the deposition procedure, the depository fluxes corresponding to successive conductive layers are then preferably directed perpendicular to one of three symmetrically located edges of the cell, in circular alternation (as illustrated in FIG. 16). As an alternative, the cells may take the form of an equilateral triangle (in plan), the various depository fluxes being directed perpendicular to the edges of the triangle, in circular alternation.

It should be noted that, although the depository flux referred to in the two preceding paragraphs is directed perpendicular to a particular edge of a cell, it still subtends a non-perpendicular angle θ with the face of the substrate.

Suitable deposition techniques for provision of the electrically conductive layers in the inventive method include Vapour Deposition (Physical or Chemical) and Laser Ablation Deposition, since these techniques are readily compatible with the requirement to controllably deposit material in a particular direction. They can also be used to provide the electrically insulating layers, in which case Sputter Deposition is also to be considered as a suitable depository method. All of these techniques lend themselves to the deposition both of conductive materials (such as metals) and insulating materials (such as certain oxides and nitrides). In particular, an insulating material such as SiO$_2$ (for example) may be conveniently deposited using either a quartz target in vacuum or a Si target in an oxygen atmosphere.

In the case of the conductive layers, the value of the (acute) non-perpendicular angle θ between the direction of the depository flux and the plane of the substrate will determine the degree of partial overlap of consecutive conductive layers, and will therefore also influence the electrical capacitance C of the manufactured electronic multilayer device. For a given choice of insulating material (dielectric), and for given thicknesses of the various layers in the device, the value of C will generally decrease as the value of θ decreases.

A considerable advantage of the inventive method is that it can be performed using a very simple deposition geometry. For example, by affixing the substrate to a rotatable holder, the entire deposition procedure can be performed using only two sources, placed side by side (as illustrated in FIG. 17). In this scenario, one of the two sources contains electrically conductive material, whereas the other contains electrically insulating material. When depositing the latter, the substrate holder is continually rotated, thereby ensuring complete depository coverage of one side of the substrate in accordance with step (d). When depositing the former, on the other hand, the substrate holder is kept fixed, but can be rotated through a fixed angle between depositions of consecutive conductive layers. Such an arrangement obviates the wide distribution of deposition sources (20, 30, 40) depicted in FIG. 1 of the cited U.S. patent.

Besides rotating the substrate during deposition of the electrically insulating material, there are other possible methods of achieving the complete depository coverage of the substrate required in step (d). For example, a plurality of depository fluxes may be directed at the substrate from different angles.

It should be noted with regard to the elucidation hereabove that the electrically conductive material need not be the same for all conductive layers, and that the electrically insulating material may also be different for different insulating layers, if so desired. In addition, it is not necessary to use the same value of θ for all the conductive layers, and the thicknesses of the various conductive or insulating layers may also mutually differ.

The planing step (e) may be performed by mechanically polishing the side of the substrate on which deposition occurred. This can be achieved, for example, by first doing a rough mechanical polish with CrO$_2$ powder, and then subsequently performing a fine chemo-mechanical polish using a suspension of quartz nano-grains in aqueous KOH or NaOH (marketed by Monsanto under the brand name Syton). Further details with regard to such planing and polishing techniques may be gleaned inter alia from Solid State Technology 37(7), pp 71–76 (1994).

The planing procedure should be performed at least as far as the original level L$_p$ of the top surfaces of the protrusions on the substrate. Depending on the cumulative thickness of the deposited layers in relation to the original height of the protrusions above the substrate surface, the planing procedure may be continued beyond L$_p$, if so desired, provided the conductive layers inside the cell are not thereby skimmed.

The planing step (e) will expose the upturned edges of each of the conductive layers, allowing direct electrical access to each such layer from a direction perpendicular to the substrate plane. In a typical example employing a rectangular cell, the exposed edges of conductive layers with an odd ordinal number will be stacked against a first side wall of the cell (with mutually interposed insulating layers), whereas the exposed edges of conductive layers with an even ordinal number will be stacked in a similar manner against a second side wall of the cell, situated opposite to the first side wall.

The selective provision of electrical contacts in step (f) can occur, for example, by depositing layers (or blobs) of solder material through a mask onto selected groupings of the upturned layer edges exposed by the planing step (e). Alternatively, metallic contact layers can be sputtered or evaporated onto selected groupings of the exposed layer edges, again with the aid of a mask. In general, it is preferable to first provide the planed surface resulting from step (e) with a protective layer of electrically insulating material (such as SiO$_2$ or Si$_3$N$_4$), before provision of electrical contacts. This protective layer can then be selectively etched away so as to expose only those upturned parts of the underlying multilayer components which are to be provided with the said localised contacts. The contacts themselves may, if so desired, be provided by depositing a uniform metallic layer on top of the selectively-etched protective layer, and then etching away any excess areas of metal, so as to form metallic islands at the contact areas. A thick layer of, for example, PbSn alloy can then be galvanically deposited on these metallic islands, if required.

In the case of the rectangular cell discussed hereabove, for example, a first contact pad can be provided upon the odd-ordinal edges, and a second contact pad can be provided upon the even-ordinal edges, thereby creating two upturned electrical contacts. Because they are upturned, such contacts lend themselves to surface mounting.

Once step (f) has been performed, the severing step (g) can be enacted using, for example, a sawing, dicing or laser scribing technique, known per se in the art.

BRIEF DESCRIPTION OF THE DRAWINGS

The invention and its attendant advantages will be further elucidated with the aid of exemplary embodiments and the accompanying schematic drawings, not of uniform scale, whereby.

DETAILED DESCRIPTION OF THE PREFERRED EMBODIMENTS

Embodiment 1

FIGS. 1–15 schematically depict various aspects of a particular embodiment of the current inventive method of manufacturing a plurality of electronic multilayer components. Corresponding features in the various Figures are denoted by the same reference symbols.

Figure 1:
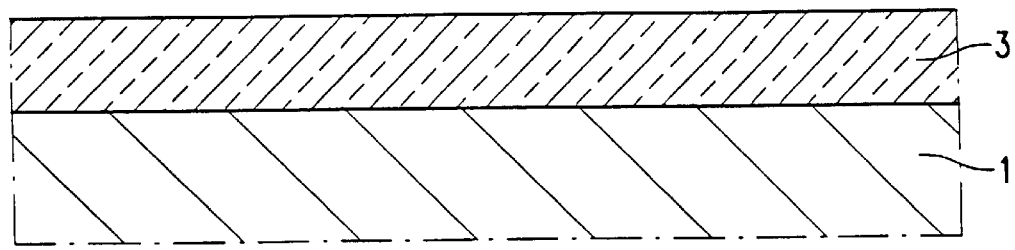
FIG. 1 renders a cross-sectional view of a composite substrate prior to its subjection to a selective etching procedure.
Figure 2:
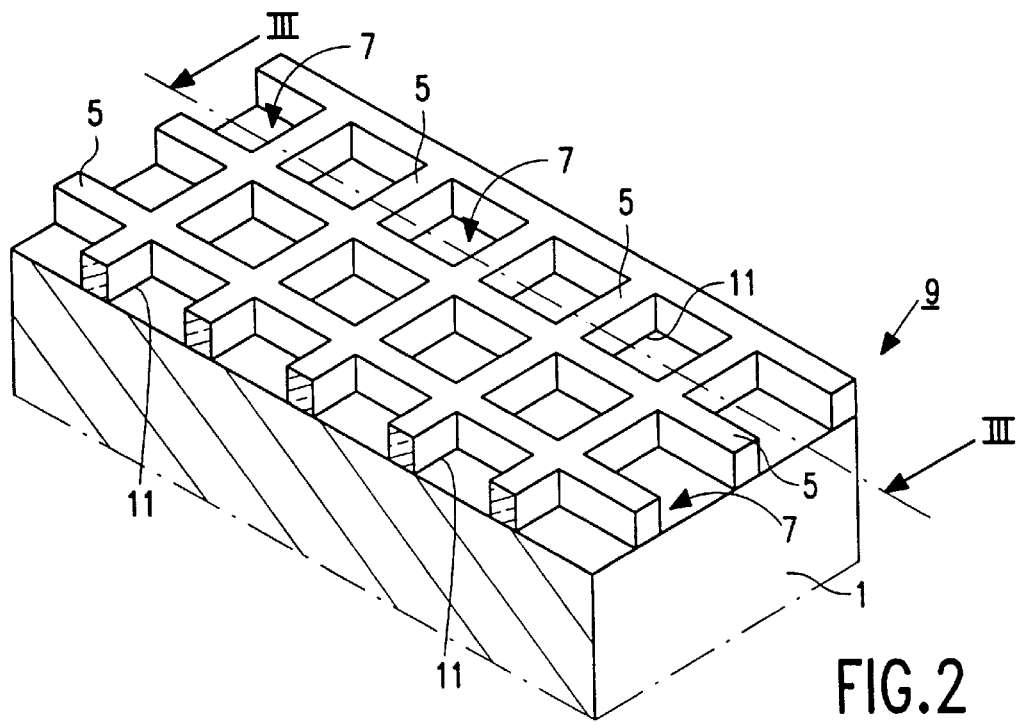
FIG. 2 renders a perspective view of the subject of FIG. 1 after the creation therein of a regular pattern of surface protrusions with the aid of a selective etching procedure.

FIG. 1 renders a cross-sectional view of a Si base 1 which has been provided with a uniform layer 3 of $SiO_2$. The base 1 may alternatively comprise $Al_2O_3$, for example. The layer 3 is provided using Plasma Chemical Vapour Deposition, and has a thickness of approximately 25 $\mu$m.

Using photolithographic techniques, the exposed planar surface of the layer 3 is provided with an etch mask in the form of a regular, orthogonal pattern of intersecting bands. The open areas between these bands are of rectangular form, and have typical dimensions of the order of 1×2 $mm^2$.

With the aid of Reactive Ion Etching or wet etching, the unmasked areas of the layer 3 are etched to a depth of 25 $\mu$m. As a result, the base 1 becomes endowed with an orthogonal pattern of surface protrusions 5 and intervening spaces (cells) 7, as shown in perspective view in FIG. 2, and in a simplified cross-section (taken along the line III—III) in FIG. 3. The resulting patterned substrate 9 is suitable for use in the inventive method, as hereinafter elucidated.

Figure 4:
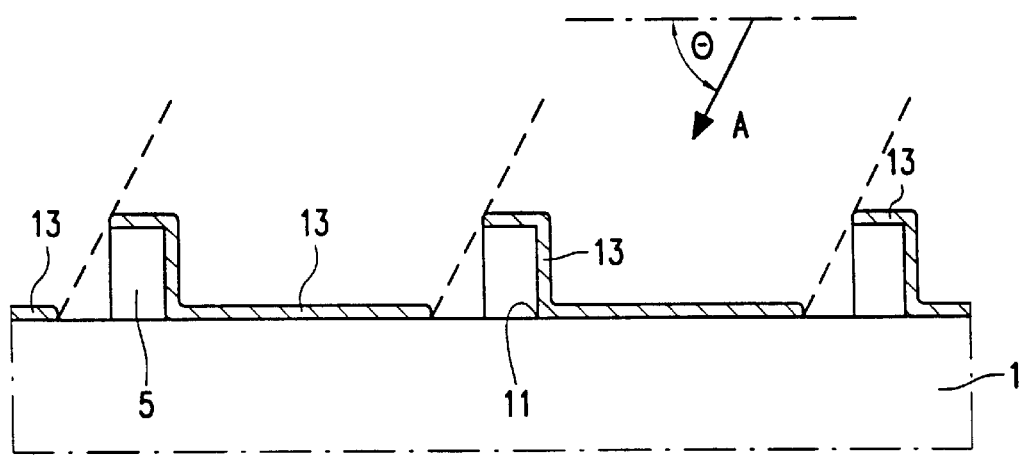
FIG. 4 depicts the subject of FIG. 3 subsequent to the non-perpendicular deposition thereupon of a first layer of electrically conductive material.

In FIG. 4, the substrate 9 has been provided with a first layer 13 of electrically conductive material (e.g. a metal such as Al, Cu or Ta) using physical vapour deposition. For the sake of clarity, the hatching of the base 1 and protrusions 5 has been omitted. The layer 13 is deposited from a direction A (parallel to the dashed lines) which subtends a non-perpendicular acute angle θ (here approximately 50°) with the plane of the substrate 9. However, the direction A preferably extends perpendicular to the edges 11 of the protrusions 5. As a result of shadow effects, the layer 13 is not continuous, but is interrupted at regular intervals in the lee of the protrusions 5. A suitable thickness for the layer 13 is of the order of 100 nm.

Figure 5:
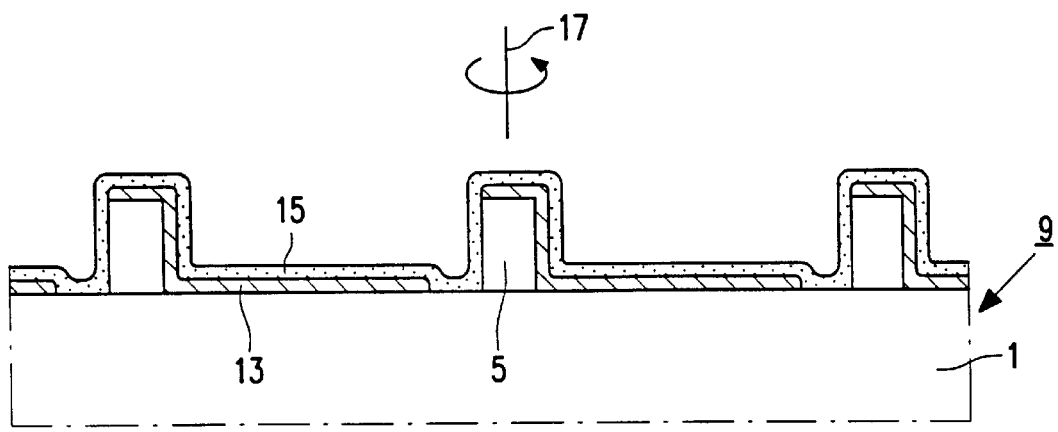
FIG. 5 illustrates the subject of FIG. 4 subsequent to its coverage with a first blanketing layer of electrically insulating material.

FIG. 5 shows the subject of FIG. 4 after the provision thereupon of a layer 15 of an electrically insulating (dielectric) material, such as $SiO_2$, $Si_3N_4$ or $Ta_2O_5$. In contrast to the previous layer 13, the layer 15 is continuous. Such continuity may be obtained inter alia by depositing the insulating material from the direction A depicted in FIG. 4, whilst simultaneously rotating the substrate 9 about an axis 17 perpendicular to its plane. A suitable thickness for the layer 15 is of the order of 100 nm.

Figure 6:
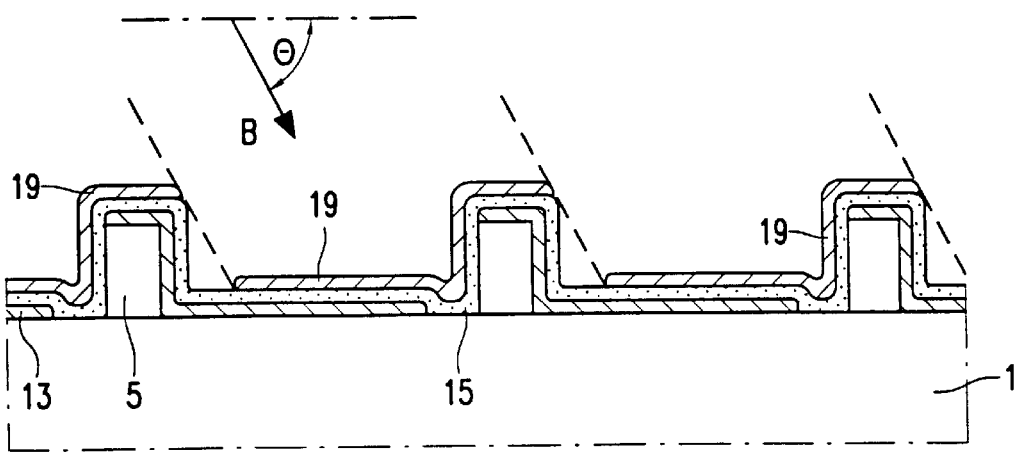
FIG. 6 shows the subject of FIG. 5 subsequent to the non-perpendicular deposition thereupon of a second layer of electrically conductive material.
Figure 7:
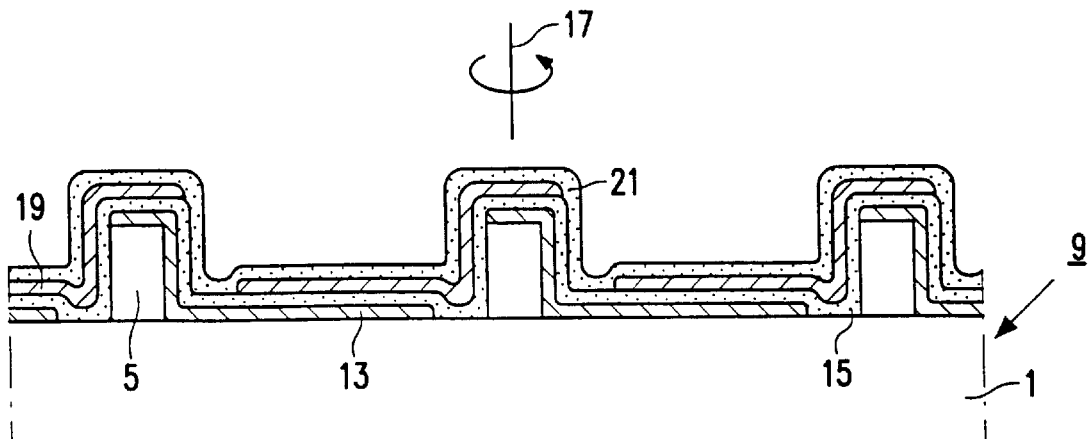
FIG. 7 depicts the subject of FIG. 6 subsequent to its coverage with a second blanketing layer of electrically insulating material.

In FIG. 6, the substrate 9 has been provided with a second layer 19 of electrically conductive material. The layer 19 is deposited from a direction B (parallel to the dashed lines) which again subtends a non-perpendicular acute angle θ with the plane of the substrate 9. The direction B is coplanar with the direction A in FIG. 4. Once the layer 19 has been deposited, it is blanketed under a layer 21 of electrically insulating material, as shown in FIG. 7, in analogy to the procedure described hereabove with reference to FIG. 5.

Figure 8:
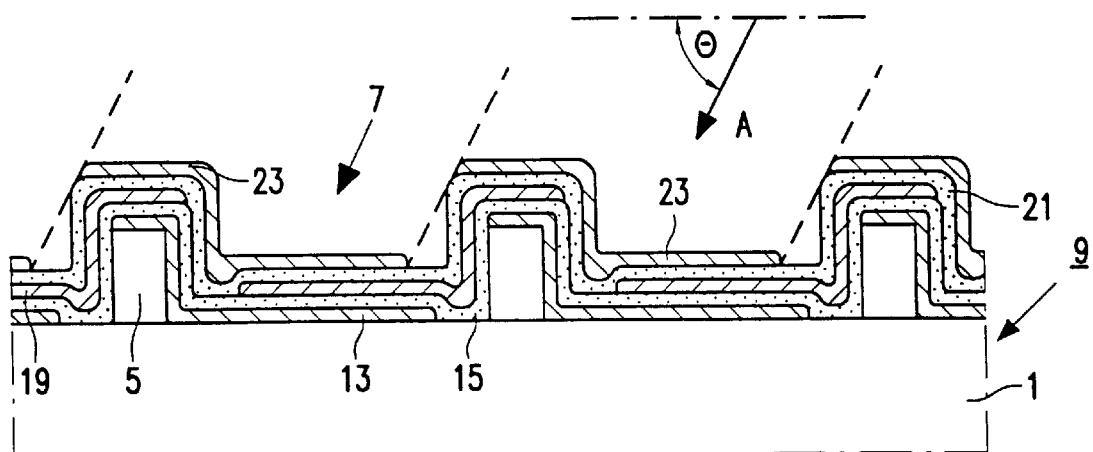
FIG. 8 illustrates the subject of FIG. 7 subsequent to the non-perpendicular deposition thereupon of a third layer of electrically conductive material.
Figure 9:
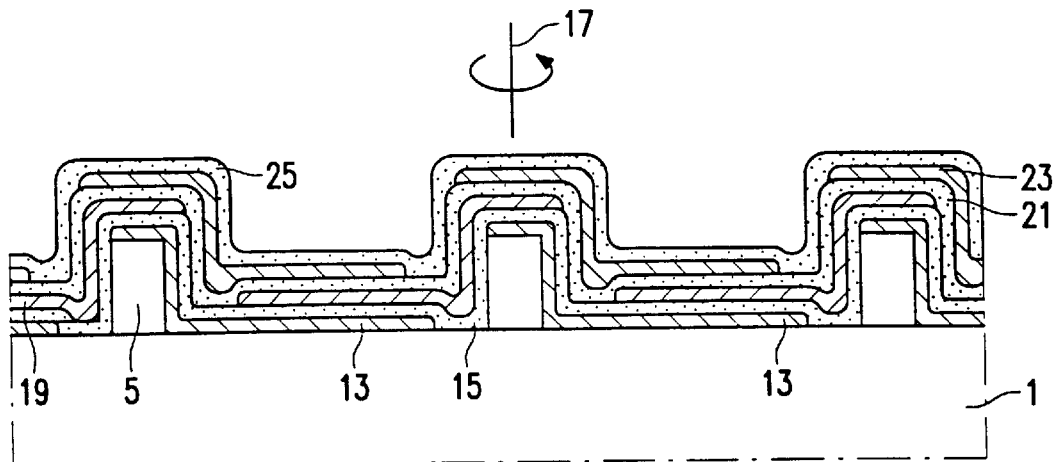
FIG. 9 shows the subject of FIG. 8 subsequent to its coverage with a third blanketing layer of electrically insulating material.

The process steps shown in FIGS. 4 and 5 are repeated in succession in FIGS. 8 and 9, respectively, which depict the consecutive provision of a conductive layer 23 (deposited from the direction A) and an insulating layer 25. If so desired, further layers can then be provided by repeating the process steps depicted in FIGS. 6 and 7, and so forth.

Figure 3:
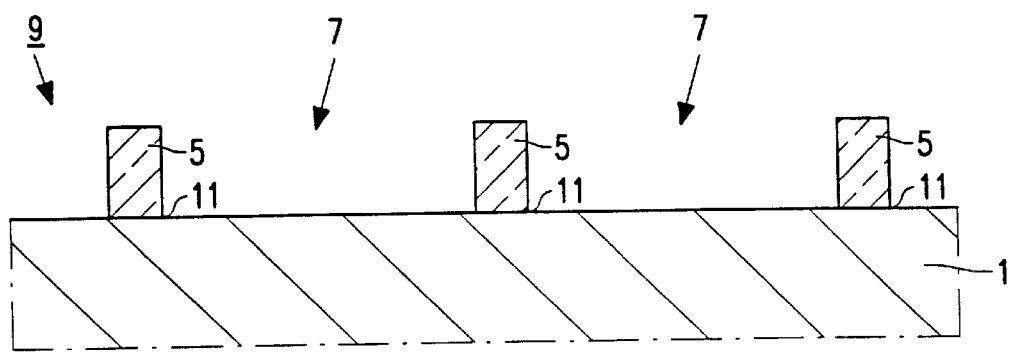
FIG. 3 shows a simplified cross-section of the subject of FIG. 2, taken along the line III—III.
Figure 10:
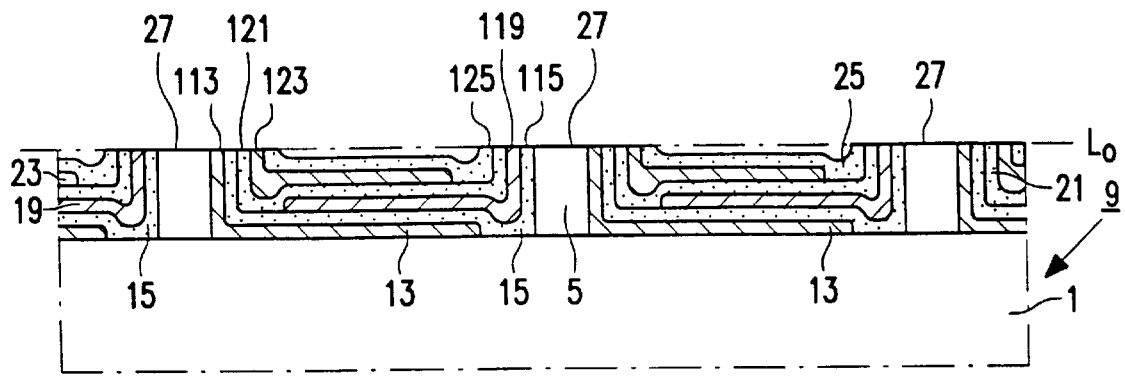
FIG. 10 depicts the subject of FIG. 9 subsequent to the enaction thereupon of a planing procedure.

In FIG. 10, the entire assembly of layers 13, 15, 19, 21, 23, 25 upon the substrate 9 has been filed down to a level Lo which is parallel to the plane of the substrate 9 and which (in this particular case) spatially coincides with the top surfaces of the protrusions 5 illustrated in FIG. 3. This planing procedure exposes flattened surfaces 27 which comprise exposed edges 113, 115, 119, 121, 123 and 125 of the layers 13, 15, 19, 21, 23 and 25, respectively.

Figure 11:
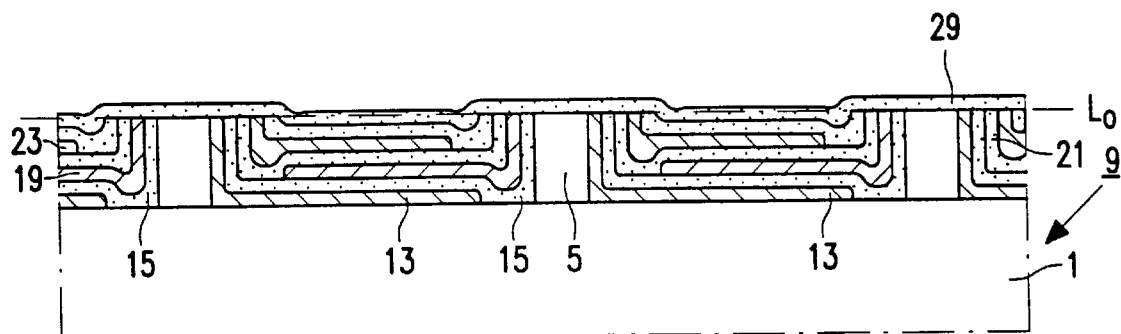
FIG. 11 illustrates the subject of FIG. 10, subsequent to its coverage with a blanketing layer of insulating material.

FIG. 11 depicts the subject of FIG. 10 after the deposition of a blanketing layer 29 of insulating material (e.g. $SiO_2$ or $Si_3N_4$) across its entire surface. This layer 29 need only be of the order of a micron thick, and can be provided by sputter deposition or vapour deposition, for example.

Figure 12:
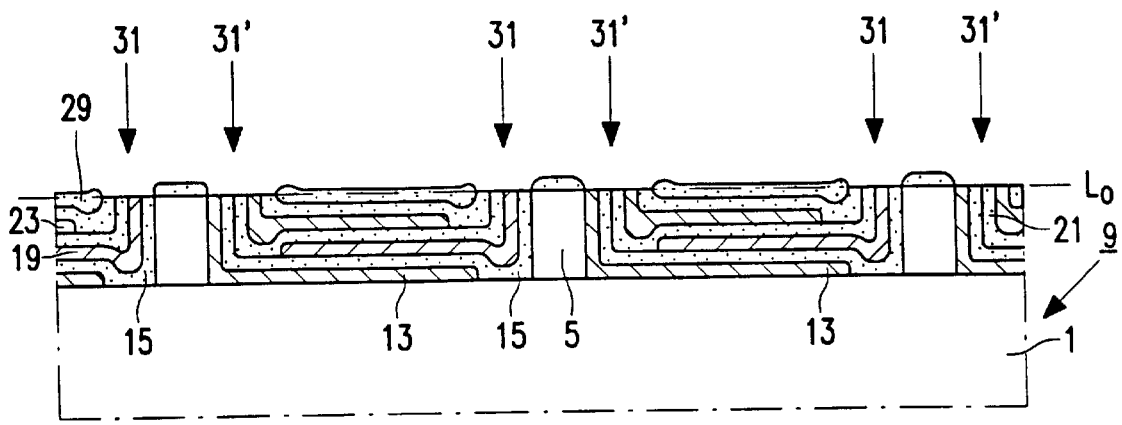
FIG. 12 shows the subject of FIG. 11, subsequent to the etching of localised contact windows in the blanketing layer of insulating material.

In FIG. 12, the layer 29 has been selectively etched away so as to create a number of contact windows 31, 31' therein. This procedure may be performed using a combination of lithography and wet etching, for example. The contact windows 31 are located above the edges 119, and the contact windows 31' are located above the edges 113, 123.

Figure 13:
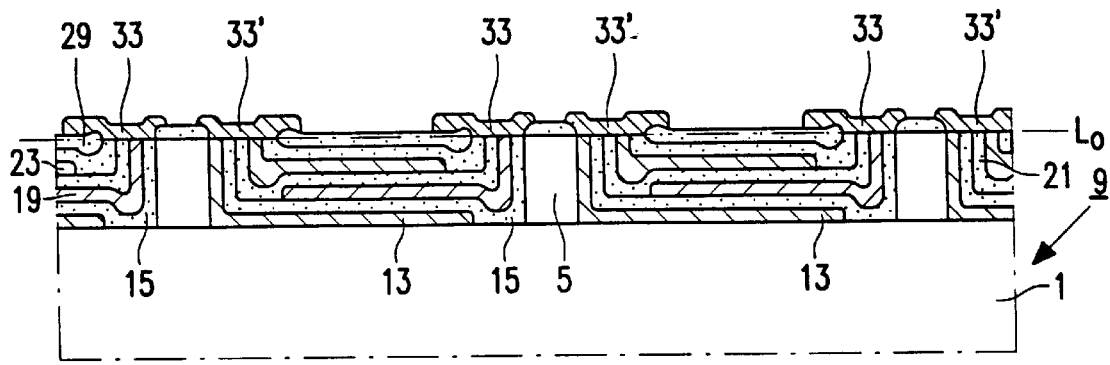
FIG. 13 depicts the subject of FIG. 12, subsequent to the provision of electrical contact layers in the contact windows.

FIG. 13 depicts the subject of FIG. 12 after the provision of localised electrical contact layers 33, 33' in the contact windows 31, 31', respectively. These layers 33, 33' comprise Cu, Au or PbSn alloy, and can be provided with the aid of a mask or a screen printing technique, for example. Alternatively, they can be provided by covering the entire layer 29 and the contact windows 31, 31' with a blanketing layer of metallic material, and then etching away excess areas of this layer so as to leave behind only the island-like layers 33, 33'. The spatial arrangement of the layers 33, 33' is such that the layers 33 make electrical contact with the edges 119 of the conductive layers 19, whereas the layers 33' make electrical contact with the edges 113, 123 of the conductive layers 13, 23, respectively.

Figure 14:
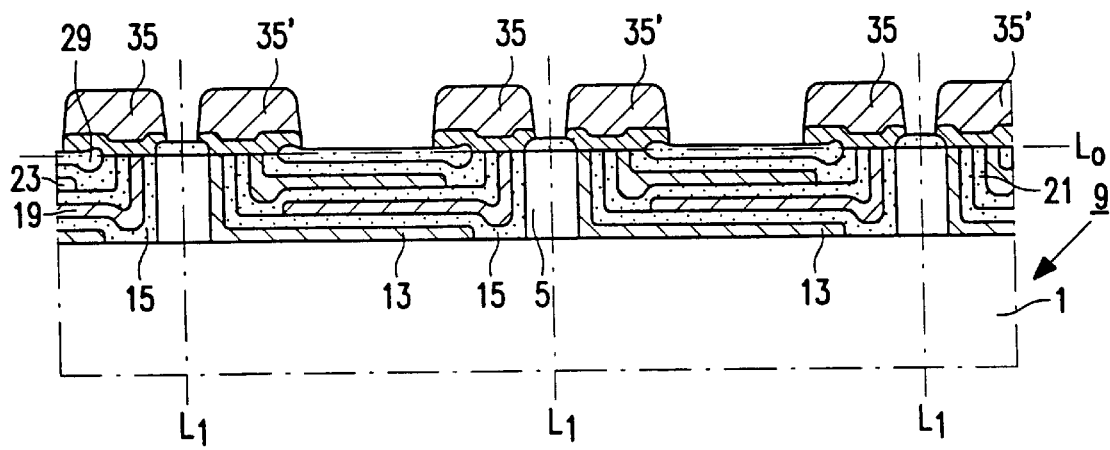
FIG. 14 illustrates the subject of FIG. 13, subsequent to the galvanic growth of contact pads upon the existing contact layers.
Figure 15:
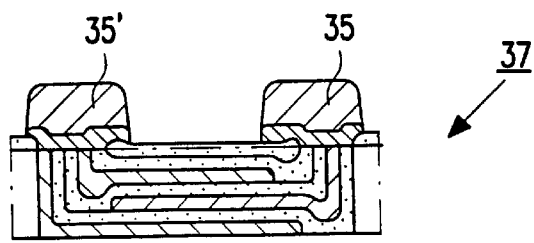
FIG. 15 shows an individual multilayer component in accordance with the invention, obtained by appropriately severing the subject of FIG. 14.

If so desired, the layers 33, 33' may be thickened by using them as bases for the galvanic deposition of further metallic material thereupon. Such a scenario is shown in FIG. 14, in which contact pads 35, 35' have been electrolytically deposited on the layers 33, 33', respectively.

After provision of the contact pads 35, 35', the substrate 9 is sawed along the lines $L_1$ which perpendicularly bisect the surface protrusions 5. The result of this process is a plurality of individual multilayer components 37 such as that illustrated in FIG. 15. By virtue of its "top contacts" 35, 35', i.e. the fact that both electrical contacts are characteristically located on one side of the component in a single plane, such a component lends itself to surface mounting. This can be achieved by positioning the component 37 on a printed circuit board in such a manner that the contacts 35, 35' are located upon two correspondingly arranged solder-coated pads on the circuit board, whereupon the component 37 can be affixed with the aid of a reflow soldering technique (for example).

The component 37 hereabove described may be used as a multilayer capacitor, since it comprises alternately stacked layers of metallic and dielectric material (e.g. Al and $SiO_2$, respectively), and consecutive conductive layers are alternately connected to opposite electrical contacts.

Embodiment 2

If, in Embodiment 1, the electrically insulating layers 15, 21, 25 comprise a piezoelectric material such as doped $BaTiO_3$ or $PbTiO_3$ (with a perovskite structure), then the resulting electronic component 37 may be used as a multilayer piezoelectric actuator.

Embodiment 3

Figure 16:
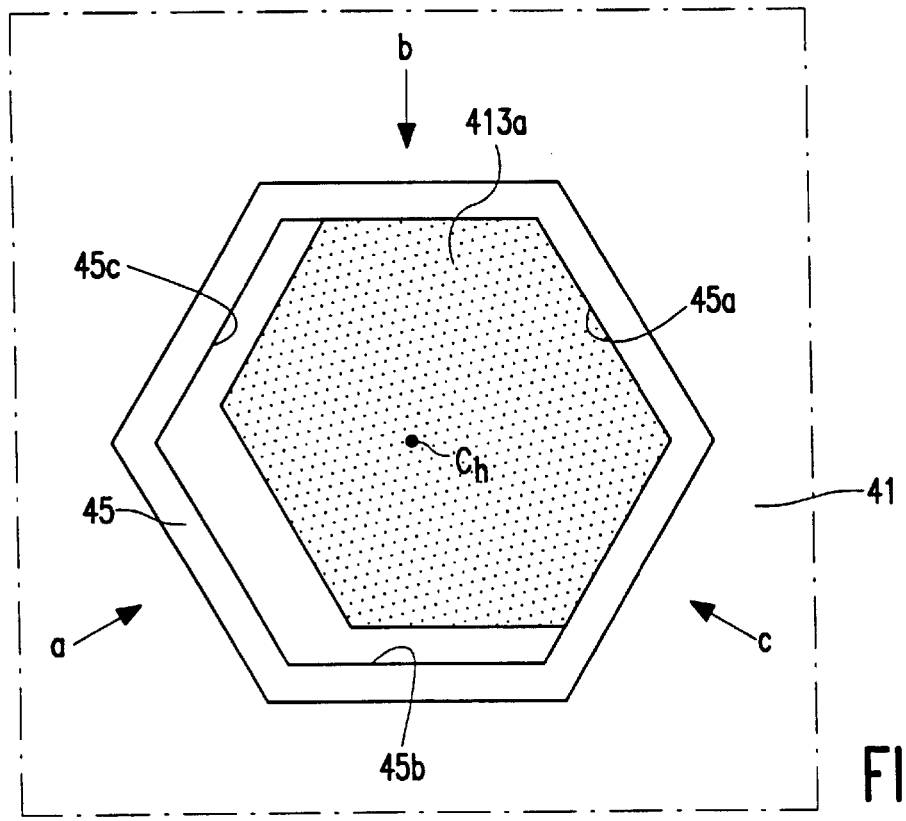
FIG. 16 renders a plan view of a planar substrate face having a surface protrusion in the form of a regular hexagonal wall.

FIG. 16 renders a plan view of part of a planar substrate 41 having a surface protrusion 45 in the form of a regular hexagonal wall. With the aid of such a substrate, the inventive method can be applied to manufacture a three-terminal electronic multilayer device.

The edges 45a, 45b, 45c of the protrusion 45 are symmetrically located with respect to the centre $c_h$ of the depicted hexagonal form. In the case of edge 45a, deposition of a layer 413a of electrically conductive material occurs from direction a, which is perpendicular to the edge 45a but which subtends a non-perpendicular angle θ with the plane of the substrate 41. The resulting layer 413a (shaded in the Figure) contacts the edge 45a, but not the edges 45b, 45c.

By depositing from the direction b or c in an analogous manner, it is possible to provide a similar layer of electrically conductive material which only contacts the edge 45b or 45c, respectively. If the substrate 41 is rotatable about an axis through $c_h$ and perpendicular to its plane, then all such layers can be deposited from a single, spatially fixed source, the substrate 41 being rotated through 120° between depositions of consecutive conductive layers.

The finished three-terminal device can be employed, for example, as:

(I) A piezoelectric actuator with built-in sensor electrodes;
(II) A decoupling capacitor, in which consecutive conductive layers are intended for connection to a positive potential, ground potential, and negative potential, respectively.

Embodiment 4

Figure 17:
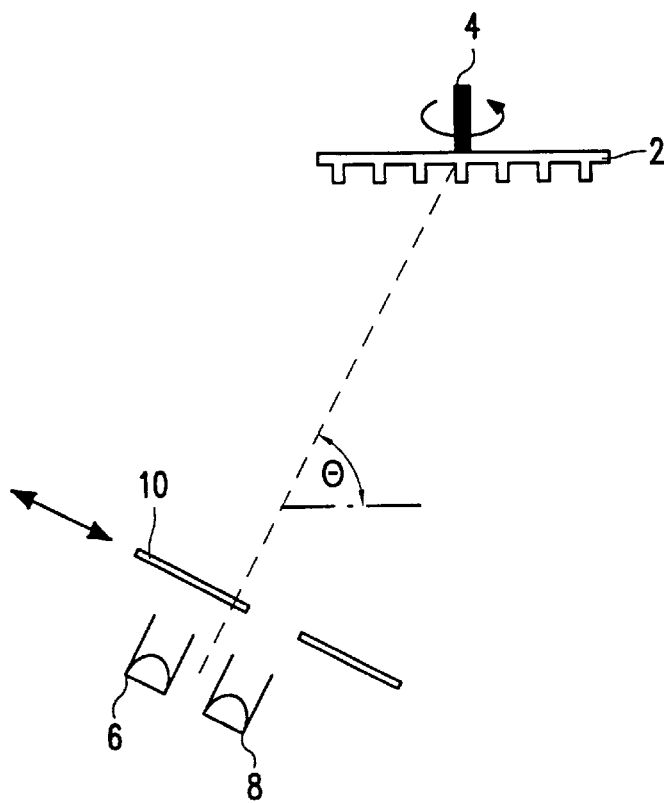
FIG. 17 shows an exemplary deposition geometry for enaction of the inventive method.

FIG. 17 depicts a simple deposition geometry with which the inventive method can be enacted.

A substrate 2, with the required pattern of surface protrusions on one face, is mounted so as to be rotatable about an axis 4 perpendicular to its plane. This substrate 2 can be accessed by the depository flux from either of two sources 6, 8, which are located side by side. The source 6 contains electrically insulating material, whereas the source 8 contains electrically conductive material. Each of the sources 6, 8 is thus oriented that the direction of its depository flux subtends an angle θ with the plane of the substrate 2.

A moveable shutter 10 is used to ensure that, at any given time, only the flux from one of the sources 6, 8 can reach the substrate 2. When depositing from source 6, the substrate 2 is continually rotated about the axis 4, so as to ensure continuous coverage of the substrate surface with insulating material. On the other hand, when depositing from source 8, the substrate 2 is kept stationary. However, between successive depositions from source 8, the substrate 2 is rotated through an angle φ in a single direction. The value of φ is 180° for the two-terminal device in Embodiment 1, and 120° for the three-terminal device in Embodiment 3.

I claim:

1. A method of manufacturing a plurality of electronic multilayer components, each of which comprises alternately stacked electrically conductive and electrically insulating layers, the electrically conductive layers being electrically connected in a periodically alternate arrangement to different edges of the multilayer component, said method comprising the steps of:
   (a) providing a substrate which is endowed with a regular pattern of surface protrusions on one face;
   (b) depositing the individual multilayer components into intervening spaces delimited by the protrusions;
   (c) depositing electrically conductive layers for connection to a given edge of a multilayer component, wherein each connection occurs on the substrate face for connection to a given edge of a multilayer component at an angle of less than 90° with respect to the substrate face, in a direction extending towards the surface protrusion delimiting the respective edge;
   (d) depositing each electrically insulating layer so as to completely cover a preceding electrically conductive layer;

(e) after deposition of a desired multilayer composition, planing the side of the substrate on which deposition occurred so as to expose one edge of each electrically conductive layer;

(f) depositing a contacting body of electrically conductive material over selected groupings of exposed edges to be mutually interconnected; and (g) separating individual multilayer components from one another by severing the substrate along the surface protrusions.

2. The method according to claim 1, the step of providing the substrate endowed with a regular pattern of surface protrusions on one face comprises providing the surface protrusions by patternwise selective removal of substrate material with the aid of an etching technique.

3. The method according to claim 1 wherein the electrically insulating layers are deposited at an angle of less than 90° with respect to the substrate face, while the substrate is simultaneously rotated about an axis substantially perpendicular to its plane.

4. The method according to claim 1, wherein severing of the substrate comprises a technique selected from the group consisting of sawing, and laser scribing.

5. The method according to claim 2 wherein the electrically insulating layers are deposited at an angle of less than 90° with respect to the substrate face, while the substrate is simultaneously rotated about an axis substantially perpendicular to its plane.

6. The method according to claim 2, wherein severing of the substrate comprises a technique selected from the group consisting of sawing, and laser scribing.

7. The method according to claim 3, wherein severing of the substrate comprises a technique selected from the group consisting of sawing, and laser scribing.

* * * * *